United States Patent [19]
Hayashi et al.

[11] Patent Number: 5,673,043
[45] Date of Patent: Sep. 30, 1997

[54] ENTROPY ENCODING WITH A REDUCED MEMORY SIZE OF CODE TABLE

[75] Inventors: Nobutake Hayashi, Hadano; Yutaka Sato, Minoo; Tadanori Ryu, Ikeda, all of Japan

[73] Assignee: Ricoh Company, Ltd., Tokyo, Japan

[21] Appl. No.: 579,296

[22] Filed: Dec. 27, 1995

[30] Foreign Application Priority Data

Dec. 28, 1994 [JP] Japan .................................. 6-326848

[51] Int. Cl.[6] .................................................. H03M 7/00
[52] U.S. Cl. ............................................................. 341/106
[58] Field of Search ................................ 341/106, 51, 107; 348/403, 404; 375/246

[56] References Cited

U.S. PATENT DOCUMENTS 4,791,598  12/1988  Liou et al. .

OTHER PUBLICATIONS

Netravali, et al., Digital Pictures: Representation and Compression, Chapter 3 (undated).

Netravali, et al., Digital Pictures: Representation and Compression, Chapter 5 (undated).

*Primary Examiner*—Brian K. Young
*Attorney, Agent, or Firm*—Cooper & Dunham LLP

[57] ABSTRACT

An entropy encoder includes: a memory for storing a code table in a compressed data format in which continuing digits "1" that continue successively from the most significant bit of a code word for a predetermined number of bits are removed, together with a control code indicative of the type of the original code word, and a code word restoring unit for restoring the original code word from the compressed code word by supplementing a predetermined number of digits "1" to the compressed code word according to the type of the original code word.

11 Claims, 5 Drawing Sheets

ENTROPY ENCODING WITH A REDUCED MEMORY SIZE OF CODE TABLE

BACKGROUND OF THE INVENTION

The present invention generally relates to the art of encoding image data. More particularly, the present invention relates to an encoder for use in image processors for encoding digital image data by an entropy encoding process, wherein the data size of a code table, which is referred to at the time of entropy encoding, is substantially reduced.

Huffman encoding process is a typical entropy encoding process used commonly for encoding digital data in various information processing systems including computer systems and telecommunication systems. In the art of image data encoding that uses Huffman encoding process, various attempts are being made to reduce the size of the memory used for storing a code table.

For example, the Japanese Laid-open Patent Publication 2-260872 describes a method of encoding image data by a Huffman encoding process with reduced memory size of the code table, by applying a shift coding process to those image data of which occurrence is relatively rare.

Further, the Japanese Laid-open Patent Publication 5-183443 describes also an image data encoding process conducted by a Huffman encoding process with reduced memory size of the code table. In the process of the foregoing reference, the code table is used for converting an incoming code of a first code system, in which the effective code values distribute relatively sparsely as in the case of variable-length coding, to a second, different code system, wherein the foregoing prior art achieves the desired reduction of the code table size by organizing the code table into a first look up table and a second look up table, the first look up table being used for spatial compression that replaces the higher order bits of incoming codes of the first code system by a more dense string of identification codes, while the second look up table being used for converting a combination of the identification code obtained by the first look up table and code values of the lower order bits of the incoming data of the first code system, into code values of the second code system.

However, such conventional encoding processes cannot provide a satisfactory reduction of code table, and it has been necessary to provide a memory of large storage capacity in the entropy encoding system for holding the code table.

SUMMARY OF THE INVENTION

Accordingly, it is an object of the present invention to provide a novel and useful encoder wherein the foregoing problems are eliminated.

Another and more specific object of the present invention is to provide an encoder and an encoding method for encoding data according to an entropy encoding process including a Huffman encoding process, in which the size of a code table used for entropy encoding is reduced substantially.

Another object of the present invention is to provide an entropy data encoding method, comprising the steps of:
compressing a code table containing original code words in terms of bits having first and second logic values, to produce a compressed code table, said step of compressing the code table comprising the substeps of:
detecting the number of continuing bits having said first logic value and continuing from the most significant bit for each of said original code words;
classifying said original code words into at least three types, according to the number of said continuing bits of said first logic value, including a type in which there is no such continuing bits of the first logic value from the most significant bit; and
compressing said original code words to create a compressed code table, by representing each of said original code words by a combination of:
a control code indicative of said type of said original code word;
code length data indicative of the length of said original code word; and
a partial code indicative of the content of said original code word from which said continuing bits of the first logic value are removed; and
restoring said original code word from said compressed code word by adding a predetermined number of continuing bits of said first logic value to said partial code word as higher order bits thereof, according to the type of said original code word as indicated by said control code.

Another object of the present invention is to provide an entropy encoding method, comprising the steps of:
restoring original code words from a compressed code table containing therein compressed code words, each of said original code words containing bits of first and second logic values, each of said compressed code words containing said compressed code words as a combination of:
a control code indicative of a type of said original code word, said type being determined according to the number of bits having said first logic value and continuing from the most significant bit of said original code word;
code length data indicative of the length of said original code word; and
a partial code indicative of the content of said original code word from which said continuing bits of said first logic value are removed;
said step of restoring said original code words comprising the steps of:
adding a predetermined number of continuing bits of said first logic value to said partial code word as higher order bits thereof according to the type of said original code word as indicated by said control code.

Another object of the present invention is to provide an encoder for encoding data according to an entropy encoding process, comprising:
a memory for storing original code words used for an entropy encoding process in a compressed form as compressed code words, each of said original code words including bits of first and second logic values, each of said compressed code words including:
a control code indicative of one of at least three types of said original code word corresponding to said compressed code word, according to the number of bits having said first logic value and continuing from the most significant bit of said original code word, said three types including a type in which there is no such continuing bits of said first logic value from the most significant bit;
a data length code indicating the length of said original code word; and
a partial code representing a remaining part of said original code word;
an address circuit supplied with input data for selecting a corresponding compressed code word in said memory;

a data length extraction unit for extracting said data length code from said selected compressed code word;

a control code extraction unit for extracting said control code from said selected compressed code word, said control code extraction unit outputting said control code as a part of said compressed data; and a partial code extraction unit supplied for extracting said partial code from said selected code word; and a code word restoring unit supplied with said control code and said partial code for restoring said original code word therefrom, said code word restoring unit restoring said original code word by adding a predetermined number of bits having said first logic value to said partial code according to the type of said original code word indicated by said control code, said predetermined number being determined by said control code.

According to the present invention, the size of the code table used for entropy encoding process is reduced substantially. Further, associated with such a reduction in the size of the code table, the size of the memory used in an entropy encoder for holding the code table is substantially reduced.

Other objects and further features of the present invention will become apparent from the following detailed description when read in conjunction with the attached drawings.

DETAILED DESCRIPTION OF THE PREFERRED EMBODIMENTS

Figure 1:
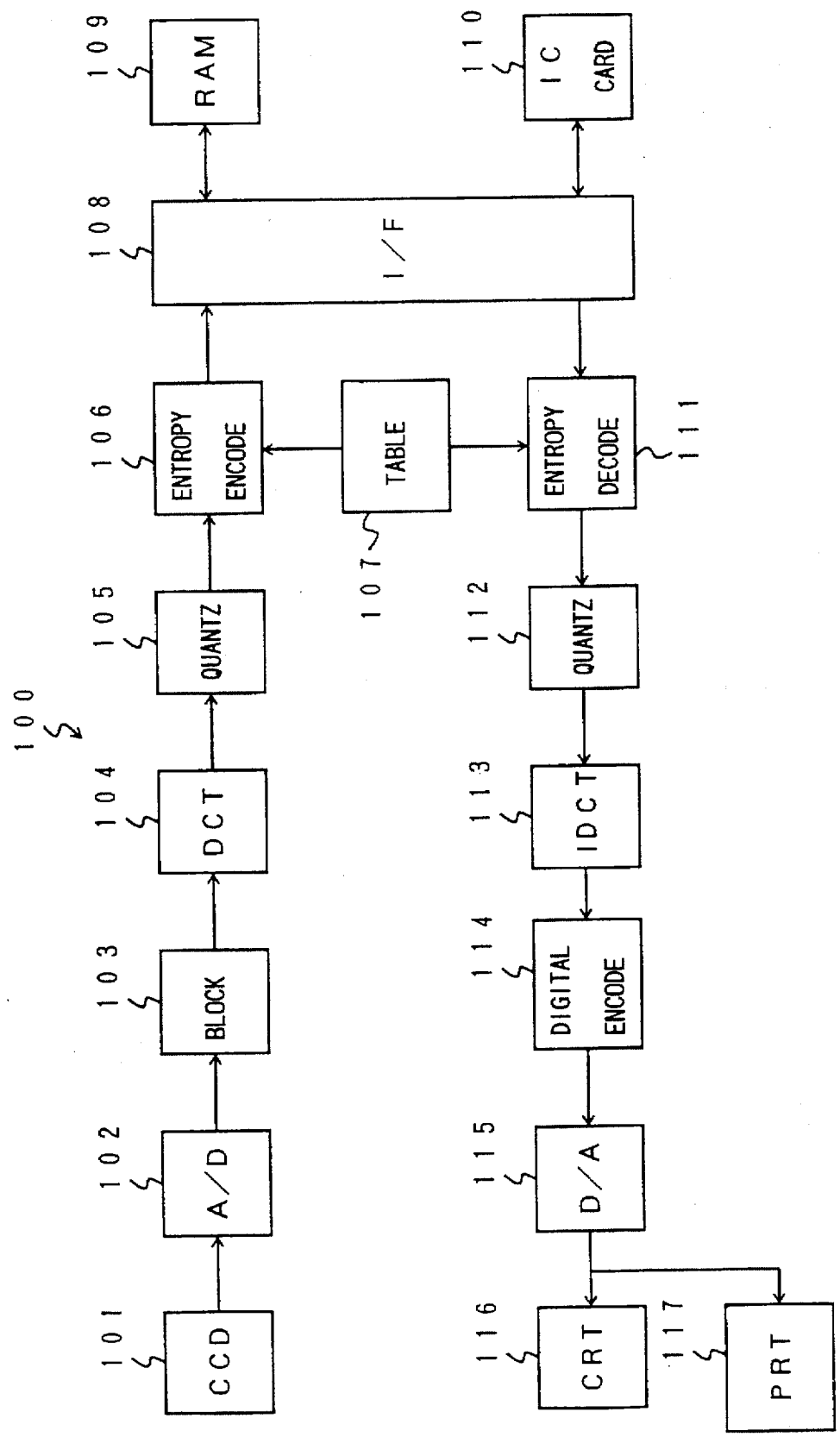
FIG. 1 is a block diagram showing the construction of a conventional digital still camera that uses the art of entropy encoding process.

FIG. 1 is a diagram showing the construction of a conventional digital still camera that uses the art of entropy encoding of image data.

Referring to FIG. 1, the digital still camera includes a CCD sensor 101 that pictures the image of an object. As is well known in the art, the CCD sensor 101 produces an analog output of the image one line by one line, and the analog output of the CCD sensor 101 thus produced is converted to a corresponding digital output by an A/D converter 102. The digital output of the A/D converter 102 is then supplied to a block conversion unit wherein the digital image data is divided into a number of block data each including image data of several pixels.

The block data thus produced is then supplied to a discrete cosine transform (DCT) unit 104 for discrete cosine transformation, wherein the transform unit 104 produces coefficient data of the discrete cosine transform applied to each of the blocks as an output thereof. The DCT coefficient data thus obtained is then supplied to a quantization circuit 105 for adaptive quantization and further therefrom to an entropy encoder 106, wherein the entropy encoder 106 carries out a run-length encoding process of the DCT coefficient data based upon a zig-zag scanning of the blocks in the captured image to produce run-length data of the DCT coefficients and further an entropy encoding of the run-length data thus obtained by referring to a look up table 107. The table 107 is designed based upon a statistic analysis of occurrence of the run-length data as is well known in the art of entropy encoding. About the DCT transformation, reference should be made to the U.S. Pat. No. 4,791,598 as well as to Chapter 5 of Netravali, A. N. and B. G. Haskel, Digital Pictures, Representation and Compression, Planum Press, New York, which are incorporated herein as reference. Further, about the art of zig-zag scanning and entropy encoding, reference should be made to Chapter 3 of Netravali and Haskel, op. cit.

The encoded coefficient data produced by the entropy encoder 106 is supplied further to a RAM 109 or an IC card 110 via an interface circuit 108.

The system of FIG. 1 further restores the original image data from the entropy-encoded data held in the RAM 109 or in the IC card 110. The encoded data are supplied either from the RAM 109 or from the IC card 110 to an entropy decoder 111 via the interface circuit 108, wherein the entropy decoder 111 decodes the data supplied thereto by referring to the loop up table 107. Thereby, the entropy decoder 111 restores the original coefficient data of discrete cosine transform as an output, and the output of the entropy decoder 111 thus obtained is then supplied to a quantization circuit 112 for quantization and further therefrom to an inverse discrete cosine transform unit 113 for inverse discrete cosine transformation. As a result of the inverse cosine transform by the unit 113, the block data of the original image is restored.

The output data of the unit 113 is further supplied to a digital encoder 114 wherein the block data is converted to digital line image data, wherein the digital line image data is converted to an analog line image signal by a D/A converter 115. The analog line image signal is then supplied to a display device 116 or to a printer 117 for visual display.

Figure 2:
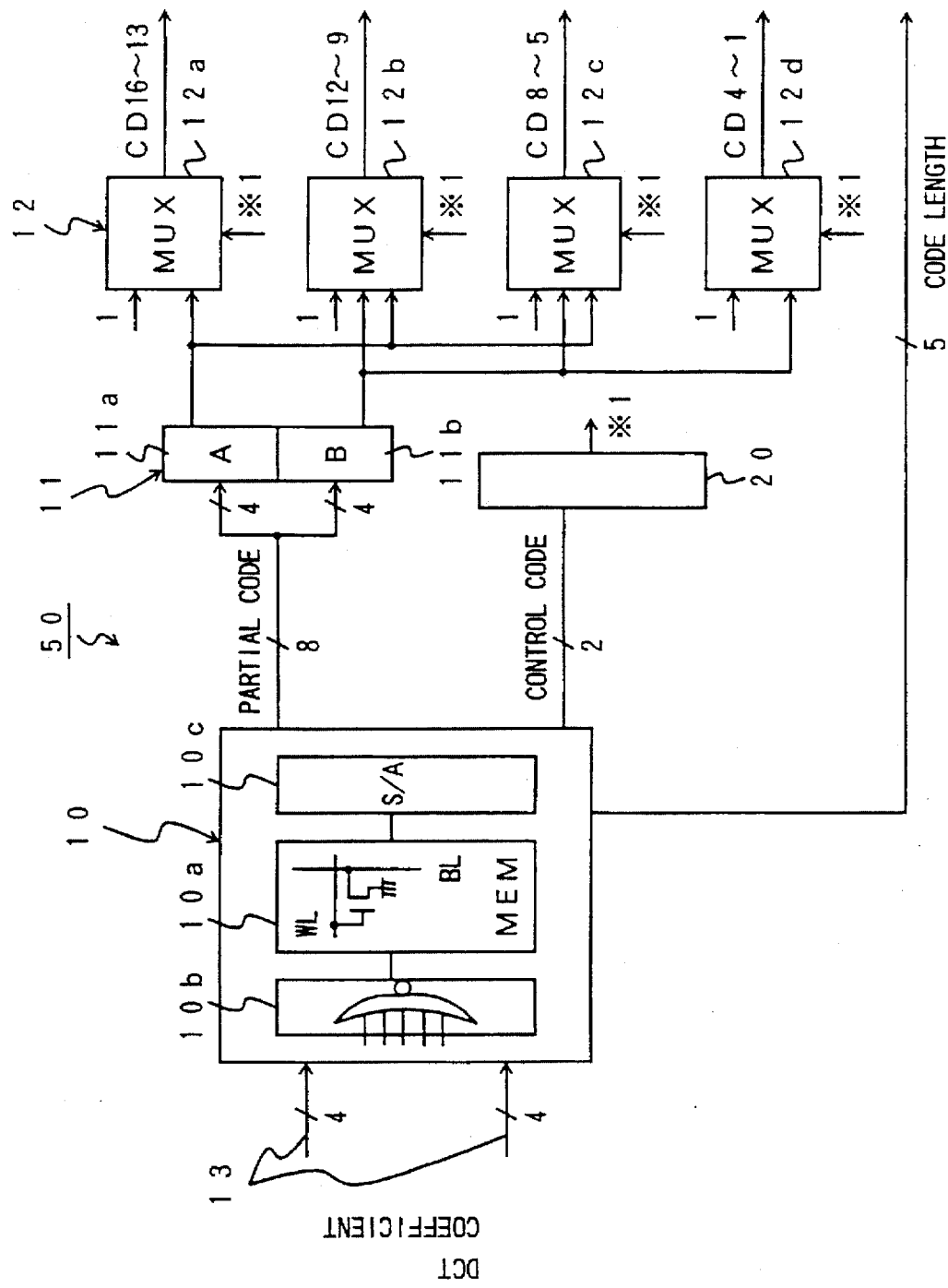
FIG. 2 is a block diagram showing the construction of an entropy encoding unit according to a first embodiment of the present invention.

FIG. 2 shows the construction of an encoder unit 50 according to a first embodiment of the present invention, wherein the encoder unit 50 corresponds to the part of the system of FIG. 1 that includes the encoder 106 and the look up table 107.

Referring to FIG. 2, the encoder unit 50 includes a memory unit 10, wherein the memory unit 10 includes a RAM 10a that stores a code table corresponding to the look up table 107 and an addressing circuit 10b, wherein the addressing circuit 10b is supplied with DCT (discrete-cosine-transform) coefficient data 13 from the quantization circuit 105 in the form of run-length data after a zig-zag scanning, and addresses the look up table 107 in the RAM 10a in response thereto. Further, a read control circuit 10c is provided for reading the content of the table 107 in the RAM 10a from a selected address.

It should be noted that the RAM 10a may include an array of memory cell transistors connected with each other by word lines WL in the row direction and bit lines BL in the column directions as usual in DRAMs. Further, the addressing circuit 10b may include a decoder that selects a word line WL in response to the coefficient data 13 supplied thereto. In addition, the read control circuit 10c may include a column switch (not shown) for selecting predetermined bit lines BL in response to the input coefficient data 13 and a sense amplifier S/A for detecting the content of the data held in the memory cell transistor in the form of electric charges.

In conventional image processing systems, the RAM 10a has been used to store the code word data indicative of the textural run length of the image data that has been pictured by the CCD camera 101, wherein the code word data has been typically represented by the code length part of 5 bits and the code word part of 16 bits as indicated in TABLE 1 below.

TABLE 1

(PRIOR ART)

| RUN LENGTHCODE | LENGTH | CODE WORD | TYPE |
|---|---|---|---|
| 0/0 (EOB) | 4 | 1010 | short |
| 0/1 | 2 | 00 | short |
| 0/2 | 2 | 01 | short |
| 0/3 | 3 | 100 | short |
| 0/4 | 4 | 1011 | short |
| 0/5 | 5 | 11010 | short |
| 0/6 | 7 | 1111000 | medium |
| 0/7 | 8 | 11111000 | medium |
| 0/8 | 10 | 1111110110 | medium |
| 0/9 | 16 | 1111111110000010 | long |
| 0/A | 16 | 1111111110000011 | long |
| 1/1 | 4 | 11000 | short |
| 1/2 | 5 | 111011 | short |
| . | . | . | . |
| . | . | . | . |
| . | . | . | . |

From TABLE 1, it will be noted that the code word data of the table 107 has a total data length of 21 bits. In other words, each code word of TABLE 1 occupies the data length of 21 bits in the memory 10a. Because of this, it has been necessary to provide a large memory device for the RAM 10a for storing such a large code table.

In the present invention, the size of the RAM 10a is reduced by compressing the code table such that the data length of the code word data in the RAM 10a is reduced further, for example from 21 bits to 15 bits.

Hereinafter, the principle of the data compression employed in the present invention for the code table of TABLE 1 will be described in detail.

In the present invention, the code word of TABLE 1 is classified into at least three types according to the number of the continuing digits "1" that continues consecutively from the most significant bit (MSB) of the code word part $CD_n$, $CD_{n-1}$, $CD_{n-2}$, ... $CD_1$.

In the illustrated example, the first type is designated as "short type" in which there is no such a successive continuation of the digits "1" for at least four bits from the MSB, the second type is designated as "medium type" in which there is a successive continuation of the digits "1" for at least four bits but smaller than eight bits from the MSB of the code word part, and the third type is designated as "long type" in which there is a successive continuation of the digits "1" for at least eight bits from the MSB of the code word part.

Thus, in the present invention, the data length of the code word part is reduced from 16 bits to 8 bits for the long type word, by removing the first eight bits, $CD_n$–$CD_{n-7}$, of the digit value "1." For example, the code word part of the original code word for the run length "0/A" is converted from "1111111110000011" to "10000011." Similarly, the code word part of the original code word for the run length "0/9" is converted from "1111111110000010" to "10000010."

Similarly, in the medium type data, the first four bits, $CD_n$–$CD_{n-3}$, of the digit value "1" are removed. Thereby, the data length of the code word is reduced by four bits.

In the case of the short type word, the data remains unchanged.

Further, in order to distinguish the foregoing three types of code word data, the present invention adds a header of two bits to each of the compressed code word data thus compressed, including the short type word. Thus, the present invention represents the compressed code word data in terms of 15 bits according to the data format of:

TABLE 2

| control | length | partial code A | partial code B |
|---|---|---|---|
| $EN_{14,13}$ | $EN_{12-8}$ | $EN_{7-4}$ | $EN_{3-0}$ | wherein, "control" specifies one of the foregoing three types of the original code word and is represented by the first two bits, $EN_{14}$ and $EN_{13}$ of the compressed code word data. The part "length," on the other hand, indicates the total length of the original code word and is identical with the "code length" of TABLE 1. Further, the last eight bits, $EN_7$–$EN_0$ are designated as "partial code," wherein the partial code is divided, in the case of the illustrated example, into "partial code A" for the upper four bits, $EN_7$–$EN_4$, and "partial code B" for the lower four bits, $EN_3$–$EN_0$. It will be noted that the partial codes "A" and "B" correspond to the part of the original code word from which the successive digits "1" are removed.

It should be noted that the foregoing classification of the code word data into different types is by no means limited to three, but one may classify the code word data into more than three types. Further, the number of the continuing digits "1" used as the basis of data type classification is by no means limited to 4.

It should be noted that the compressed code data of TABLE 1 is stored in the RAM 10a of FIG. 2 for each of the run length data 13. Thus, it is necessary to restore the original code word data from the compressed code word in the RAM 10a in the construction of FIG. 2 when conducting the data encoding of captured image data.

Hereinafter, the construction for restoring the original code word form the compressed code word in the RAM 10a will be described in detail.

Referring to FIG. 2, the encoder 50 includes a register 11 for storing the partial codes A and B ($EN_7$–$EN_0$) read out from the RAM 10a by the read control circuit 10c, wherein the register 11 includes a first part 11a formed of a four bit register for storing the partial code A ($EN_7$–$EN_4$) and a second part 11b also of a four bit register for storing the partial code B ($EN_3$–$EN_0$). Further, the encoder 50 includes a type control circuit 20 supplied with the control code ($EN_{14}$, $EN_{13}$) read out from the RAM 10a by the read control circuit 10c, wherein the type control circuit 20 produces a control signal in response to the content of the control code read out from the RAM 10a. The read control circuit 10c further read out the code length data ($EN_{12}$–ENS) from the RAM 10a.

It will be noted that the encoder 50 further includes an array 12 of multiplexers 12a–12d each supplied with a digit "1," wherein the multiplexer 12a produces the data bits $CD_{16}$–$CD_{13}$, the multiplexer 12b produces the data bits $CD_{12}$–$CD_9$, the multiplexer 12c produces the data bits $CD_8$–$CD_5$, and the multiplexer 12d produces the data bits $CD_4$–$CD_1$, all of the uncompressed, original code word. Thereby, the register 11a supplies the partial code A to each of the multiplexers 12a–12c simultaneously, the register 11b supplies the partial code B to each of the multiplexers 12b–12d, and the multiplexers 12a–12d are controlled by the output of the type control circuit 20, such that, when the type of the original code word is the long type, the multiplexers 12c and 12d output the partial codes A and B ($EN_7$–$EN_4$, $EN_3$–$EN_0$) respectively as the data bits $CD_8$–$CD_5$ and $CD_4$–$CD_1$. In this case, the multiplexers 12a and 12b output the digits "1" for the data bits $CD_{16}$–$CD_{13}$ and $CD_{12}$–$CD_9$, respectively, and the original, long type code word, such as the run length data 0/9 or 0/A of TABLE 1, is restored from the compressed code table in the RAM 10a.

When the original code word is the medium type, the multiplexers 12b and 12c output the partial codes A and B respectively as the data bits $CD_{12}$–$CD_9$ and $CD_8$–$CD_5$. Further, the multiplexer 12a outputs the digit "1" for the data bits $CD_{16}$–$CD_{13}$, and the original code word is restored. Further, the multiplexer 12d adds the digits "1" for the dummy data bits $CD_4$–$CD_1$, wherein the code length data $EN_{12}$–$EN_8$ indicates that the last four bits are excessive, dummy data. Thereby, the original, medium type code word is successfully restored from the compressed code table in the RAM 10a.

When the original code word is the short type, the multiplexers 12a and 12b output the partial codes A and b respectively as the data bits $CD_{16}$–$CD_{13}$ and $CD_{12}$ –$CD_9$, wherein the multiplexers 12c and 12d add the digits "1" as the dummy data for the data bits $CD_8$–$CD_5$ and $CD_4$–$CD_1$, respectively. Similarly to the case of the medium type data, the code length data specifying the total length of the code word indicates that the digits "1" in the data bits $CD_8$–$CD_5$ and $CD_{4-CD1}$ are dummy data. Again, the original, short type code word is successfully restored from the compressed code table in the RAM 10a.

Summarizing above, the original short, medium and long code words are restored from the partial codes A and B ($EN_7$–$EN_4$, $EN_3$–$EN_0$) in the RAM 10a according to the relationship of TABLE 3.

$EN_7$–$EN_4$ and a partial code B of "1011" for the data bits $EN_3$–$EN_0$, together with the control data indicating that the code word is a medium type word. As the current code word is the medium type, the registers 11a and 11b supply the foregoing data "1101" and "1011" to the multiplexers 12b and 12c under control of the type control circuit 20, and the data "1011" and "1101" are set for the data bits $CD_{12}$–$CD_9$ and $CD_8$–$CD_5$ of the restored, original code word. Further, the multiplexers 12a and 12d are controlled by the type control circuit 20 so as to output the data "1111" as the data bits $CD_{16}$–$CD_{13}$ and $CD_4$–$CD_1$, respectively. As a result, a code word "1111110110111111" is obtained, from which the original code word "1111110110" is restored based upon the code length data.

In the case of the run length data "0/A" of TABLE 1, the RAM 10a stores a partial code A of "1000" for the data bits $EN_7$–$EN_4$ and a partial code B of "0011" for the data bits $EN_3$–$EN_0$, together with the control data indicating that the code word is a long type word. As the current code word is the long type, the registers 11a and 11b supply the foregoing data "1000" and "0011" to the multiplexers 12c and 12d under control of the type control circuit 20, and the data "1000" and "0011" are set for the data bits $CD_8$–$CD_5$ and $CD_4$–$CD_1$ of the restored, original code word. Further, the multiplexers 12a and 12b are controlled by the type control circuit 20 so as to output the data "1111" as the data bits $CD_{16}$–$CD_{13}$ and $CD_{12}$–$CD_9$ , respectively. As a result, the original code word "1111111110000011" is restored.

According to the present invention, one can reduce the size of the RAM 10a substantially as a result of the data compression of the code table.

Figure 3:
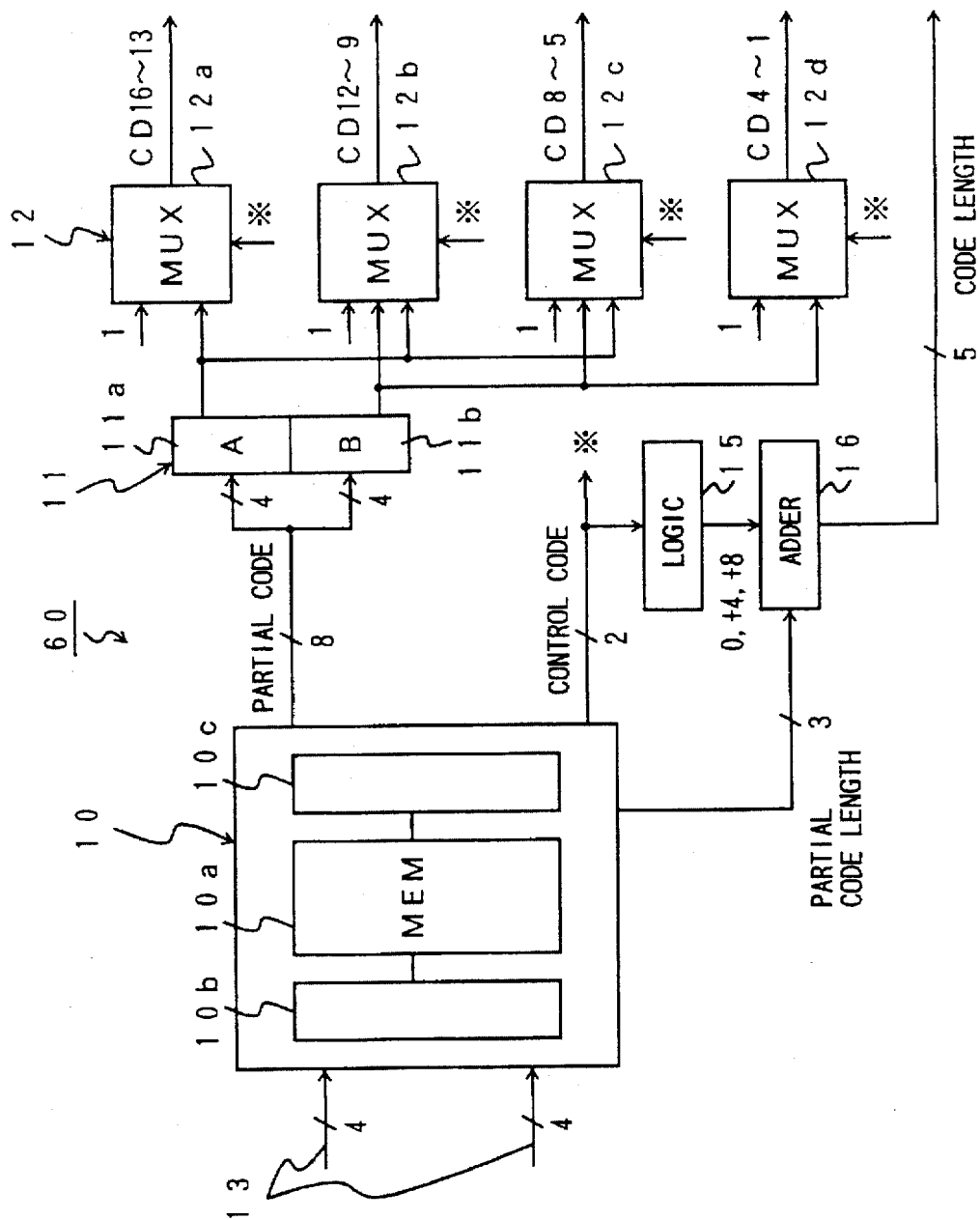
FIG. 3 is a block diagram showing the construction of an entropy encoding unit according to a second embodiment of the present invention.

Next, an entropy encoder 60 according to a second embodiment of the present invention will be described with reference to FIG. 3. In FIG. 3, those parts corresponding to

TABLE 3

| | $EN_7$ | $EN_6$ | $EN_5$ | $EN_4$ | $EN_3$ | $EN_2$ | $EN_1$ | $EN_0$ |
|---|---|---|---|---|---|---|---|---|
| short | $CD_n$ | $CD_{n-1}$ | $CD_{n-2}$ | $CD_{n-3}$ | $CD_{n-4}$ | $CD_{n-5}$ | $CD_{n-6}$ | $CD_{n-7}$ |
| medium | $CD_{n-4}$ | $CD_{n-5}$ | $CD_{n-6}$ | $CD_{n-7}$ | $CD_{n-8}$ | $CD_{n-9}$ | $CD_{n-10}$ | $CD_{n-11}$ |
| long | $CD_{n-8}$ | $CD_{n-9}$ | $CD_{n-10}$ | $CD_{n-11}$ | $CD_{n-12}$ | $CD_{n-13}$ | $CD_{n-14}$ | $CD_{n-15}$ |

Hereinafter, some examples of restoring the original code word from a corresponding compressed code word will be presented.

In the case of the run length data "0/4" of TABLE 1, the RAM 10a stores a partial code A of "1011" for the data bits $EN_7$–$EN_4$, together with the control data indicating that the code word is a short type word. In this case there is no partial code B, and the RAM 10a *stores dummy data* "1111" for the data bits $EN_3$–$EN_0$. As the current code word is a short type word, the register 11a supplies the foregoing data "1011" to the multiplexer 12a under control of the type control circuit 20, and the data "1011" is set for the data bits $CD_{16}$–$CD_{13}$ of the restored, original code word. Further, the dummy data "1111" is supplied from the register 11b to the multiplexer 12b under control of the type control circuit 20, and the dummy data "1111" is set for the data bits $CD_{12}$–$CD_9$ of the restored code word. Furthermore, the multiplexers 12c and 12d are controlled by the type control circuit 20 so as to output the data "1111" as the data bits $CD_8$–$CD_5$ and $CD_4$–$CD_1$, respectively. As a result, a code word "1011111111111111" is obtained, from which the original code word "1011" is restored based upon the code length data that indicates that the total code length is four bits.

In the case of the run length data "0/8" of TABLE 1, the RAM 10a stores a partial code A of "1101" for the data bits the parts described already are designated by the same reference numerals and the description thereof will be omitted.

In the present embodiment, the code length data of TABLE 2 is compressed from the original 5 bits used for representing the code length of the original code word of 16 bits, to 3 bits. It should be noted that the code length of 3 bits is sufficient for representing the total code length of 8 bits for the partial codes A and B. Thereby, the compressed code word stored in the RAM 10a in the present embodiment is represented according to the data format of:

TABLE 4

| control | length | partial code A | partial code B |
|---|---|---|---|
| $EN_{12,11}$ | $EN_{10-8}$ | $EN_{7-4}$ | $EN_{3-0}$ |

It should be noted that the compressed code length data $EN_{10}$–$EN_8$ of TABLE 4 corresponds to the original code length data shown in TABLE 1, with a constant "0, " "4 " or "8" subtracted therefrom according , to the type of the original code word, in correspondence to the reduction of code length of the original code word. Thus, in the case of the short type code word, the compressed code length data $EN_{10}$–$EN_8$ represent a code length value identical with the value of the original code length data of TABLE 1, while in the case of the medium type code word, the compressed code length data $E_{10}$–$EN_8$ represent a code length value smaller than the value of the original code length data by a numeral "4." In the case of the log type code word, the compressed code length data $E_{10}$–$EN_8$ represent a code length value smaller than the value of the original code length data by a numeral "8."

Thus, in order to restore the original code length data from the compressed code length data $EN_{10}$–$EN_8$, the encoder 60 of the present embodiment employs a logic circuit 15 that detects the type of the original code word based upon the control code data read out from the RAM 10a, wherein the logic circuit supplies one of the numerals "0," "4" and "8" to an adder circuit 16 for adding to the partial code length data EN10–$EN_8$ read out from the RAM 10a. For example, the logic circuit 15 supplies the numeral "0" to the adder 16 when the original code word is a short type word, and the adder 16 outputs five-bit data including therein the partial code length data EN10–$EN_8$ at the lower bits as the code length data, as there is no compression of the code length data for the short type code words.

When the original code word is a medium type word, the logic circuit 15 supplies the numeral "4" to the adder 16, wherein the adder 16 adds the numeral "4" to the partial code length data read out from the RAM 10a. Thereby, five-bit data indicative of the sum of the numeral "4" and the partial code data is obtained from the adder 16 as the restored code length data. Similarly, when the original code word is a medium type word, the logic circuit 15 supplies the numeral "8" to the adder 16, wherein the adder 16 adds the numeral to the partial code length data read out from the RAM 10a. Thereby, five-bit data indicative of the sum of the numeral "8" and the partial code data is obtained from the adder 16 as the restored code length data.

As other aspects of the present embodiment is substantially the same as that of the encoder 50 shown in FIG. 2, further description of the encoder 60 will be omitted.

Figure 4:
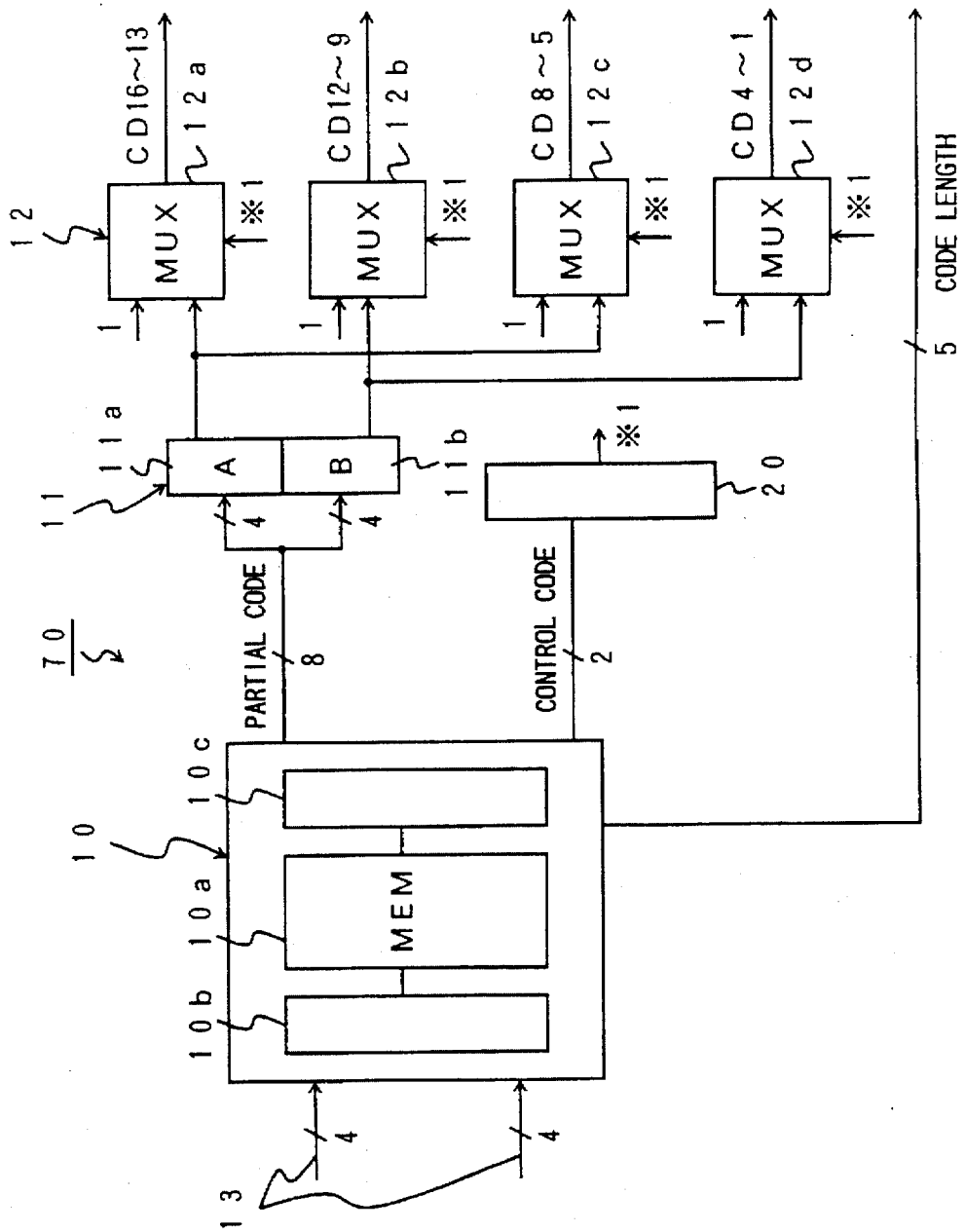
FIG. 4 is a block diagram showing the construction of an entropy encoding unit according to a third embodiment of the present invention.

Next, an entropy encoder 70 according to a third embodiment will be described with reference to FIG. 4, wherein those parts described previously are designated by the same reference numerals and the description thereof will be omitted.

In the present embodiment, the construction of the encoder 70 is substantially identical with that of the encoder 50 of FIG. 1, except that the partial code A is stored in the lower four bits of the RAM 10a when the code word is a medium type word. Associated therewith, the partial code B of a medium type word is stored at the higher order side of the partial code A.

Thus, the content of the RAM 10a is represented according to the format of:

the multiplexer 21a acts similarly to the multiplexer 12a, the multiplexer 21b acts similarly to the multiplexer 12b, the multiplexer 21c acts similarly to the multiplexer 12c, and the multiplexer 21d acts similarly to the multiplexer 12d. Thus, in the description hereinafter, only the case in which the selected code word is a medium type word will be explained, with reference to a typical example of the run length data "0/8."

Referring to TABLE 1, the code word part of the run length data "0/8" is given as "1111110110," which indicates that the partial code A and the partial code B after data compression are represented respectively as "1101" and "10." Thus, the RAM 10a stores the partial code A in the lower four bits as "1101" and the partial code B in the upper four bits as "1011", wherein the last two digits "1" of the partial code B is added to the data "10" as dummy data. Thereby, the RAM 10a stores the partial codes "A" and "B" as "10111101".

In this case, the partial code B is read out from the RAM 10a and is held in the part 11a of the register 11. Simultaneously, the partial code A is read out from the RAM 10a and is held in the part 11b of the register 11. Thereby, the register part 11a holds the data "1011" in correspondence to the partial code B while the register part 11b holds the data "1101" in correspondence to the partial code A.

The content of the register part 11a is supplied to the multiplexers 21a–21c simultaneously similarly as before. Further, the content of the register part 11b is supplied to the multiplexers 21b–21d simultaneously.

In the case of the medium type code word, the multiplexer 21a is controlled by the output of the type control circuit 20 indicating that the current code word is a medium type word, and outputs the digit "1" for the data bits $CD_{16}$–$CD_{13}$. Further, the multiplexer 21b is controlled by the output of the type control circuit 20 and outputs the content of the register part 11b, in other words the partial code A, for the data bits $CD_{12}$–$CD_9$. Similarly, the multiplexer 21c outputs the content of the register part 11a, in other words the partial code B, for the data bits $CD_8$–$CD_5$, under control of the type control circuit 20. In addition, the multiplexer 21d outputs the dummy digit "1" for the data bits $CD_4$–$CD_1$. Thereby, the original, uncompressed code word is successfully restored from the RAM 10a, even when the order of the partial code A and the partial code B in the RAM 10a is reversed.

Figure 5:
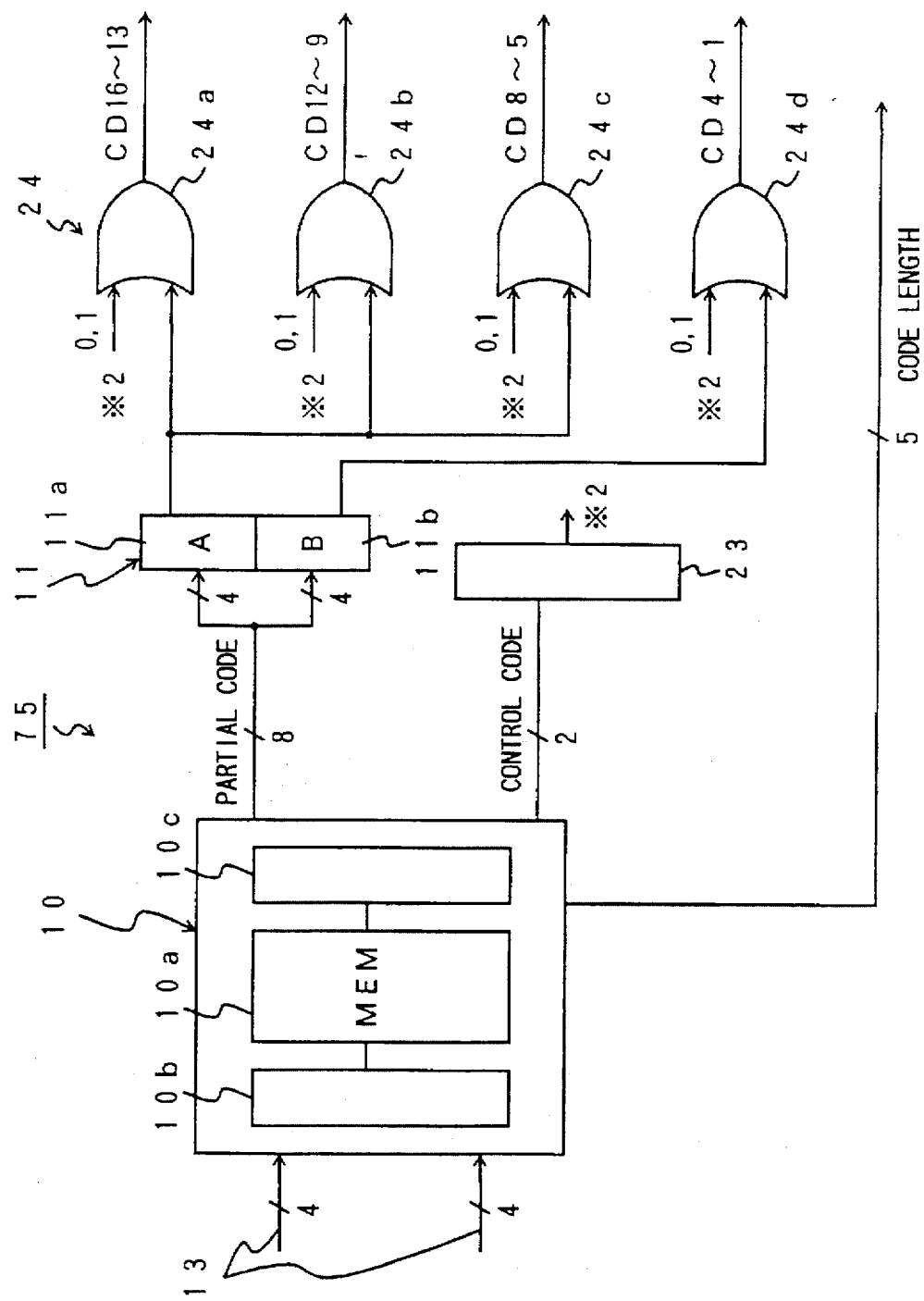
FIG. 5 is a block diagram showing the construction of an entropy encoding unit according to a fourth embodiment of the present invention.

Next, a register 75 according to a fourth embodiment of the present invention will be described with reference to FIG. 5, wherein those parts corresponding to the parts described previously are designated by the same reference numerals and the description thereof will be omitted.

In the present embodiment, the RAM 10a stores the code words therein according to the compressed data format shown in TABLE 2, wherein the control code ($EN_{14}$, $EN_{13}$) therein is supplied to a type control circuit 23 corresponding

TABLE 5

|        | $EN_7$ | $EN_6$ | $EN_5$ | $EN_4$ | $EN_3$ | $EN_2$ | $EN_1$ | $EN_0$ |
|--------|--------|--------|--------|--------|--------|--------|--------|--------|
| short  | $CD_n$ | $CD_{n-1}$ | $CD_{n-2}$ | $CD_{n-3}$ | $CD_{n-4}$ | $CD_{n-5}$ | $CD_{n-6}$ | $CD_{n-7}$ |
| medium | $CD_{n-8}$ | $CD_{n-9}$ | $CD_{n-10}$ | $CD_{n-11}$ | $CD_{n-4}$ | $CD_{n-5}$ | $CD_{n-6}$ | $CD_{n-7}$ |
| long   | $CD_{n-8}$ | $CD_{n-9}$ | $CD_{n-10}$ | $CD_{n-11}$ | $CD_{n-12}$ | $CD_{n-13}$ | $CD_{n-14}$ | $CD_{n-15}$ |

In such a case, the encoder 70 restores the original code word similarly as before when the selected original code word is a short type word or a long type word. In this case, to the type control circuit 20. Further, OR gates 24a–24d are provided in correspondence to the multiplexers 21a–21d respectively to form an OR gate array 24, wherein the type control circuit 23 produces output logic data "0" and "1" and supplies the same to each of the OR gates 24a–24d, such that the logic data "0" is supplied simultaneously to the OR gates 24a and 24b and the logic data "1" is supplied simultaneously to the OR gates 24c and 24d when the code word is a short type word, or such that the logic data "1" is supplied simultaneously to the OR gates 24a and 24d and the logic data "0" is supplied simultaneously to the OR gates 24b and 24c when the code word is a medium type word, or such that the logic data "1" is supplied simultaneously to the OR gates 21a and 21b and the logic data "0" is supplied simultaneously to the OR gates 21c and 21d when the code word is a long type word.

Thus, when the current word is a short type word such as the run length data "0/4" of TABLE 1, the type control circuit 23 supplies the logic data "0" to the OR gates 24a and 24b, and the OR gates 24a and 24b output the partial codes A and B held in the register parts 11a and 11b of the register 11, respectively, as the bit data $CD_{16}$–$CD_{13}$ and the bit data $CD_{12}$–$CD_9$. In other words, the OR gate 24a outputs the data "1011" held in the register part 11a for the bit data $CD_{16}$–$CD_{13}$, and the OR gate 24b outputs the data "1111" held in the register part 11b for the bit data $CD_{12}$–$CD_9$. Simultaneously, the type control circuit 23 supplies the logic data "1" to the OR gates 24c and 24d, and the OR gates 24c and 24d output the logic data "1" supplied thereto, for the bit data $CD_8$–$CD_5$ and $CD_4$–$CD_1$, respectively. As a result, the encoder 75 restores the original code word from the compressed code word in the RAM 10a in the form of "1011111111111111," together with the code length data indicating that the effective code length of the code word is four bits. Thereby, the original code word "1011" is restored for the run length data 0/4.

When the current word is a medium type word such as the run length data "0/8," the output data "1" is supplied from the type control circuit 23 to the OR gates 24a and 24c. Thereby, the OR gates 24a and 24d output the logic data "1" for the bit data $CD_{16}$–$CD_{13}$ and for the bit data $CD_4$–$CD_1$, respectively. On the other hand, the type control circuit 23 supplies the output data "0" to the OR gates 24b and 24c, and the OR gates 24b and 24c output the partial codes A ("1011") and B ("1101") held in the register parts 11a and 11b of the register 11, respectively for the bit data $CD_{12}$–$CD_9$ and $CD_8$–$CD_5$. Thus, in the case of the run length data "0/8," the encoder 75 restores the original code word "1111110110111111" together with the code length data, and based upon the code length data, the original code word "1111110110" is restored for the run length data "0/8."

When the current word is a long type word such as the run length data "0/A," the output data "1" is supplied from the type control circuit 23 to the OR gates 24a and 24b. Thereby, the OR gates 24a and 24b output the logic data "1" for the bit data $CD_{16}$–$CD_{13}$ and for the bit data $CD_{12}$–$CD_9$, respectively. On the other hand, the type control circuit 23 supplies the output data "0" to the OR gates 24c and 24d, and the OR gates 24c and 24d output the partial codes A ("1011") and B ("1101") held in the register parts 11a and 11b of the register 11, respectively for the bit data $CD_8$–$CD_5$ and $CD_4$–$CD_1$. Thus, in the case of the run length data "0/A," the encoder 75 restores the original code word "1111111110000011" together with the code length data, and based upon the code length data, the original code word "1111111110000011" is restored for the run length data "0/A."

By using the OR circuits 24a–24d in place of the multiplexers 12a–12d or 23a–23d, the construction of the encoder 75 is simplified substantially.

Further, the present invention is not limited to the embodiments described heretofore, but various variations and modifications may be made without departing from the scope of the present invention.

What is claimed is:

1. An entropy data encoding method, comprising the steps of:

compressing a code table containing original code words in terms of bits having first and second logic values, to produce a compressed code table, said step of compressing the code table comprising the substeps of:
    detecting the number of continuing bits having said first logic value and continuing from the most significant bit for each of said original code words;
    classifying said original code words into at least three types, according to the number of said continuing bits of said first logic value, including a type in which there is no such continuing bits of the first logic value from the most significant bit; and
    compressing said original code words to create a compressed code table, by representing each of said original code words by a combination of:
        a control code indicative of said type of said original code word;
        code length data indicative of the length of said original code word; and
        a partial code indicative of the content of said original code word from which said continuing bits of the first logic value are removed; and restoring said original code word from said compressed code word by adding a predetermined number of continuing bits of said first logic value to said partial code word as higher order bits thereof, according to the type of said original code word as indicated by said control code.

2. An entropy encoding method as claimed in claim 1, wherein said code length data indicates a code length of said partial code, said code length data thereby representing the code length of said original code word in terms of the code length of said partial code and the type of said original code word as represented by said control code.

3. An entropy encoding method as claimed in claim 2, wherein said method further includes a step of restoring a code length of said original code word from said code length data that indicates the code length of said partial code, said step of restoring the code length data including the steps of:
    identifying the type of said original code word based upon said control code; and
    increasing said code length data according to the type of said original code word, such that said code length data is increased by a value corresponding to the number of the bits having said first logic value and continuing from the most significant bit in said original code word.

4. An entropy encoding method, comprising the steps of:
restoring original code words from a compressed code table containing therein compressed code words, each of said original code words containing bits of first and second logic values, each of said compressed code words containing said compressed code words as a combination of:
    a control code indicative of a type of said original code word, said type being determined according to the number of bits having said first logic value and continuing from the most significant bit of said original code word;
    code length data indicative of the length of said original code word; and
    a partial code indicative of the content of said original code word from which said continuing bits of said first logic value are removed;

said step of restoring said original code words comprising the steps of:

adding a predetermined number of continuing bits of said first logic value to said partial code word as higher order bits thereof according to the type of said original code word as indicated by said control code.

5. An entropy encoding method as claimed in claim 4, wherein said code length data indicates a code length of said partial code, said code length data thereby representing the code length of said original code word in terms of the code length of said partial code and the type of said original code word as represented by said control code.

6. An entropy encoding method as claimed in claim 5, wherein said method further includes a step of restoring a code length of said original code word from said code length data that indicates the code length of said partial code, said step of restoring the code length data including the steps of:

identifying the type of said original code word based upon said control code; and increasing said code length data according to the type of said original code word, such that said code length data is increased by a value corresponding to the number of the bits having said first logic value and continuing from the most significant bit in said original code word.

7. An encoder for encoding data according to an entropy encoding process, comprising:

a memory for storing original code words used for an entropy encoding process in a compressed form as compressed code words, each of said original code words including bits of first and second logic values, each of said compressed code words including:

a control code indicative of one of at least three types of said original code word corresponding to said compressed code word, according to the number of bits having said first logic value and continuing from the most significant bit of said original code word, said three types including a type in which there is no such continuing bits of said first logic value from the most significant bit;

a data length code indicating the length of said original code word; and a partial code representing a remaining part of said original code word;

an address circuit supplied with input data for selecting a corresponding compressed code word in said memory;

a data length extraction unit for extracting said data length code from said selected compressed code word;

a control code extraction unit for extracting said control code from said selected compressed code word, said control code extraction unit outputting said control code as a part of said compressed data; and a partial code extraction unit supplied for extracting said partial code from said selected code word; and a code word restoring unit supplied with said control code and said partial code for restoring said original code word therefrom, said code word restoring unit restoring said original code word by adding a predetermined number of bits having said first logic value to said partial code according to the type of said original code word indicated by said control code, said predetermined number being determined by said control code.

8. An encoder as claimed in claim 7, wherein said code word restoring unit comprises:

a register supplied with said partial code from said partial code extraction unit for holding said partial code therein;

a controller supplied with said control code from said control code extraction unit for producing a control signal in response to said control code;

a selection circuit supplied with said partial code from said register for selectively outputting either one of said partial code and a digit having said first logic value for each of bits of said original code word.

9. An encoder as claimed in claim 8, wherein said register includes a first register section for storing a first part of said partial code and a second register section for storing a second part of said partial code, said selection circuit including first through fourth selection circuit elements respectively producing first through fourth bits, fifth through eighth bits, ninth through twelfth bits, and thirteenth through sixteenth bits of said original code word as measured from the most significant bit of said original code word, under control of said controller, said first register section supplying said first part of said partial code to said first through third selection circuit elements simultaneously, said second register section supplying said second part of said partial code to said second through fourth selection circuit elements simultaneously.

10. An encoder as claimed in claim 9, wherein said first through fourth selection circuit elements comprise first through fourth OR circuit respectively, said first and third OR circuits being supplied with said first part of said partial code from said first register section, said second and fourth OR circuits being supplied with said second part of said partial code from said second register section, said controller supplying one of logic data "0" and "1" to two of said first through fourth OR circuits as an input signal depending upon the content of said control code and the other of logic data "0" and "1" to the other two of said fist through fourth OR circuits as an input signal depending upon the content of said control code.

11. An encoder as claimed in claim 8, wherein said memory stores said data length code as a code indicating the data length of said partial code, and wherein said code word restoring unit further includes a logic circuit for discriminating the content of said control code and for producing numeric data to be added to said data length code arithmetically, and an adder circuit supplied with said data length code from said data length extraction unit, for adding said numeric data to said data length code arithmetically.

* * * * *